United States Patent [19]

Zepp

[11] Patent Number: 5,513,187
[45] Date of Patent: Apr. 30, 1996

[54] PROCESS FOR TESTING INTEGRATED CIRCUITS WITH AT LEAST ONE LOGIC CIRCUIT AND TESTABLE INTEGRATED CIRCUIT

[75] Inventor: Claus-Peter Zepp, München, Germany

[73] Assignee: Siemens Aktiengesellschaft, Munich, Germany

[21] Appl. No.: 193,152

[22] PCT Filed: Aug. 3, 1992

[86] PCT No.: PCT/DE92/00638

§ 371 Date: May 26, 1994

§ 102(e) Date: May 26, 1994

[87] PCT Pub. No.: WO93/03434

PCT Pub. Date: Feb. 18, 1993

[30] Foreign Application Priority Data

Aug. 8, 1991 [DE] Germany .......... 41 26 333.2

[51] Int. Cl.$^6$ .................. G01R 31/28
[52] U.S. Cl. .................. 371/22.3
[58] Field of Search .................. 371/22.3, 22.5, 371/25.1; 324/158 R

[56] References Cited

U.S. PATENT DOCUMENTS

5,173,906  12/1992  Dreibelbis et al. .......... 371/22.5
5,220,281   6/1993  Matsuki ................ 371/72.3

FOREIGN PATENT DOCUMENTS

0403436  12/1990  European Pat. Off. .

OTHER PUBLICATIONS

"A Logic Chip Delay–Test Method Based On System Timing", Motika et al, IBM Journal of Research & Development, vol. 34, No. 2/3, Mar./May 1990, United States, pp. 299–312.

Standardmässiges Testen Komplexer Systeme: Teil 1: Elemente des hierarchischen Tests, Pete Fleming et al, Elektronik (1989), Germany, pp. 52–57.

Standardmässiges Testen Komplexer Systeme: Teil 2: Vorteile des hierarchischen Tests, Pete Fleming et al, Elektronik (1989), Germany, pp. 102–108.

Standardmässiges Testen Komplexer Systeme: Teil 3: Bustreiber und Latches mit JTAG–Testports, Horst Jungert et al, Elektronik (1989), Germany, pp. 96–103.

Standardmässiges Testen Komplexer Systeme: Teil 4: Entwurf mit JTAG–Testport, Lee Whetsel et al, Elektronik (1989), Germany, pp. 69–74.

Standardmässiges Testen Komplexer Systeme: Teil 5: ASSET–Software Für JTAG–Testsysteme, Bernhard Geisberger, Elektronik (1989), Germany, pp. 62–68.

*Primary Examiner*—Vincent P. Canney
*Attorney, Agent, or Firm*—Hill, Steadman & Simpson

[57] ABSTRACT

For real-time testing, two test combinations TK1 and TK2 are written to the input trigger circuits (EK1 to EK2) of the logic circuit (LS1) to be tested and to the output trigger circuits (AP1 to AP2) of the upstream test device (TE) or of an upstream logic circuit (LSO). The second test combination TK2 is transferred with the first system test pulse to the input trigger circuits (EK1 to EK3), and with the second test pulse the associated output combination (AT2) is transferred into the output trigger circuits (AK1 to AK2). This output combination is subsequently transferred into the test device (E) and checked. An integrated circuit suitable for carrying out the process has trigger circuits with two clock inputs.

10 Claims, 5 Drawing Sheets

PROCESS FOR TESTING INTEGRATED CIRCUITS WITH AT LEAST ONE LOGIC CIRCUIT AND TESTABLE INTEGRATED CIRCUIT

BACKGROUND OF THE INVENTION

The invention relates to a process for testing integrated circuits having at least one logic circuit with a logic network surrounded by boundary-scan cells.

For testing integrated logic circuits and subassemblies fitted with logic circuits, the boundary-scan process is used. The logic circuits which can be tested by this process have at their signal inputs and their signal outputs test stages (boundary-scan cells) which in each case include a change-over switch and at least one memory stage. The input test stages and the output test stages are able to be connected as a shift register chain. Also, all the shift register chains of a plurality of logic circuits arranged on one subassembly can be interconnected in series. The boundary-scan process is described in the Journal "electronic" in a series of continuing articles in Issue 12 (pages 52 to 57) / 13 (pages 102 to 108) / 14 (pages 96 to 103) / 15 (pages 69 to 74) and 17 (pages 62 to 68) 1989. With the aid of the boundary-scan process, the connecting lines from the plug connector of the subassembly to the terminals (inputs and outputs) of the integrated modules and connecting lines between the integrated modules and the connections to the terminals can be checked. Similarly, it is possible furthermore to test the functions of the logic circuits of the integrated modules. For this purpose, test combinations are written in series to the shift registers. The output combination of the logic circuit is transferred into the output test stages, read out and checked. This may also take place with a correspondingly extensive test program in the case of complete switching subassemblies. Until now, only a static test of the built-in logic circuits was carried out, if such a test was performed at all.

Although the use of test multiplexers which are connected into the signal lines also permits a real-time testing of the logic circuits, they require a high outlay due to additional terminal points and complicated wiring.

Test methods for logic circuits are described in the printed document IBM Journal of Research and Development, 34 (1990) March/May, No. 2/3, Armonk, N.Y., U.S., Pages 299 to 312. The equivalent circuit diagram of a large-scale circuit, represented in FIG. 1, comprises two logic networks which are separated from each other by shift-register trigger circuits. Run-time tests are carried out for the integrated large-scale circuit and its various parts. Thus, FIG. 2 shows the use of the shift-register trigger circuits forming double trigger-circuit cells in a boundary-scan arrangement for the dynamic testing of logic networks. In FIG. 10 (Page 307, top) the testing of a logic network between the shift-register trigger circuits is represented. For this purpose, use is made in each case of cells comprising two memory stages L1, L2, in the first memory stage of which initially test information is written serially in the boundary-scan process. The test information written to the first trigger circuits L1 is transferred by a second clock into the second trigger circuits L2, which are connected directly upstream of the inputs of the logic network. With a following clock of a further clock signal, the output information of the logic network is transferred into further double trigger-circuit cells. Nothing is said about the switching of the double trigger-circuit cells in the case of operation.

The run-time test between data inputs PIs and data outputs POs according to FIG. 6 is carried out in a known way without use of boundary-scan cells by direct applying of the test information and comparison of the output information with the expected result in a test device. If a plurality of these logic circuits are connected in a chain, a dynamic testing of the individual circuits becomes virtually impossible however, since neither can the data inputs be supplied with the necessary test information nor is the output information directly accessible to the logic circuits.

SUMMARY OF THE INVENTION

The object of the invention is to specify a process for the real-time testing of logic circuits which requires only little additional circuitry. In addition, the logic circuits suitable for carrying out the process are to be specified.

In general terms the process of the present invention is for testing integrated modules having at least one logic circuit with a logic network surrounded by boundary-scan cells. For static testing in serial mode, input trigger circuits and output trigger circuits of the boundary-scan cells are able to be connected in series as shift registers for the serial writing and reading of test information. In each case at least one test combination is written to the input trigger circuits and/or to the output trigger circuits. For dynamic testing, as in the operating mode, the input trigger circuits are connected into the signal lines between input terminal points of the logic circuit and inputs of the logic network. The output trigger circuits are connected into the signal lines between the outputs of the logic network and the output terminal points of the logic circuit. For dynamic testing, in each case a first test combination is written to the input trigger circuits and/or to the output trigger circuits. At least one second test combination is applied from parallel outputs of a test device or of an upstream logic circuit to the input terminal points of the input trigger circuits. At the latest before the dynamic testing with at least two successive system test pulses the input trigger circuits and the output trigger circuits are switched from serial mode into operating mode. With a first system test pulse the second test combination, and with each further system test pulse in each case a further test combination is transferred in parallel into the input trigger circuits. With a second system test pulse (and if appropriate with each further system test pulse) in each case an output combination of the at least one logic circuit is stored as a logical sequence of the second test combination (and if appropriate for further test combinations) in the output trigger circuits. The output combinations are checked in the test device.

Advantageous developments of the present invention are as follows.

The input trigger circuits and the output trigger circuits are driven by the same and in each case at least two successive system test pulses.

The test combinations are written to the input trigger circuits and output trigger circuits, forming boundary registers of logic circuits connected in a chain.

The output combinations stored in the boundary registers are read out serially.

The output combinations of the last logic circuit are transferred in parallel into the test device.

All the relevant sequences of test combinations are successively tested for testing the logic circuit.

If there are clocked memory elements in the logic network, the number of system test clocks is increased until a change occurs in the output combination caused by the memory element.

The present invention is also a testable integrated circuit with at least one logic circuit having a logic network surrounded by boundary-scan cells. In the integrated circuit, for the serial writing and reading of test information, input trigger circuits and output trigger circuits of the boundary-scan cells can be connected in series as shift registers. For dynamic testing and in the operating mode, the input trigger circuits are connected into the signal lines between the input terminal points of the logic circuit and inputs of the logic network. The output trigger circuits are connected into the signal lines between the outputs of the logic network and the output terminal points of the logic circuit.

Advantageous developments of this embodiment of the present invention are as follows.

The inputs of the input trigger circuits and the inputs of the output trigger circuits have multiplexers connected upstream of them, by which the input and output trigger circuits can, according to choice, be connected into the signal lines or connected as shift registers. The input trigger circuits and the output trigger circuits in each case have two clock inputs. Equivalent clock inputs of the input trigger circuits and output trigger circuits are interconnected.

The input trigger circuits and the output trigger circuits in each case have two clock inputs with in each case one assigned data input being connected by the one data input into the signal line and being connected by the other data input to the preceding trigger circuit as a shift register.

By the process according to the invention, a real-time testing is possible. The additional circuitry corresponds approximately to that in the boundary-scan process. Only a few additional terminal points are required. Pure gate circuits can already be tested by double pulses of the system test signal in a plurality of test cycles. If the logic circuit contains clocked memory elements, the number of system test pulses per test cycle can be increased without any problem. Similarly subassemblies which have a plurality of integrated circuits (ICs, ASICs) connected in a chain can be tested.

It is expedient if the test combination is written serially into the input and output trigger circuits. Due to the series connection of the shift registers formed by input and output trigger circuits, the serial writing-in of the test combinations takes place via a single terminal point of the subassembly. It is necessary to check the function with all relevant sequences of test combinations, one-zero and zero-one transitions having to be applied alternately to the inputs of the actual logic circuit.

It is advantageous if not only sequences of two binary states but also of three—or more—for example 001,010, 101 etc., can be emitted in each case at the outputs of the test device. The associated output combinations are written in parallel to the output trigger circuits of the logic circuit and to the input test stages of the test device. As a result, the testing time can be shortened significantly. With each further output test register and input test register of the test device, in each case a further combination can be dynamically tested through and the output combinations can be transferred in parallel into the test device. If a plurality of logic circuits are connected in a chain, only two output combinations can be tested in each case if all the output combinations are to be checked with defined test combinations. Similarly, only two test combinations can also be applied to the inputs of the downstream logic circuit and their output combinations checked. A test cycle then comprises two test combinations and two system test pulses. In the case of logic circuits which contain not only gate circuits but also trigger circuits, the number of system test pulses per test cycle may of course be increased.

It is expedient if the test stages are constructed similarly to the boundary-scan test stages. In this case, a separation of the input-side and output-side storing clocks can also be performed, it then also being possible to operate with the corresponding test programs. In contrast to the known test processes, the input and output trigger circuits of the test stages can be triggered according to choice by a test clock signal or a system clock signal.

In this case it is expedient to provide trigger circuits with two clock inputs in order to avoid additional running times due to clock change-over switches. By linking the clock inputs with the data inputs, it is also possible to dispense with change-over switches (multiplexers) in the input and output test stages. Edge-triggered trigger circuits are preferably used,

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
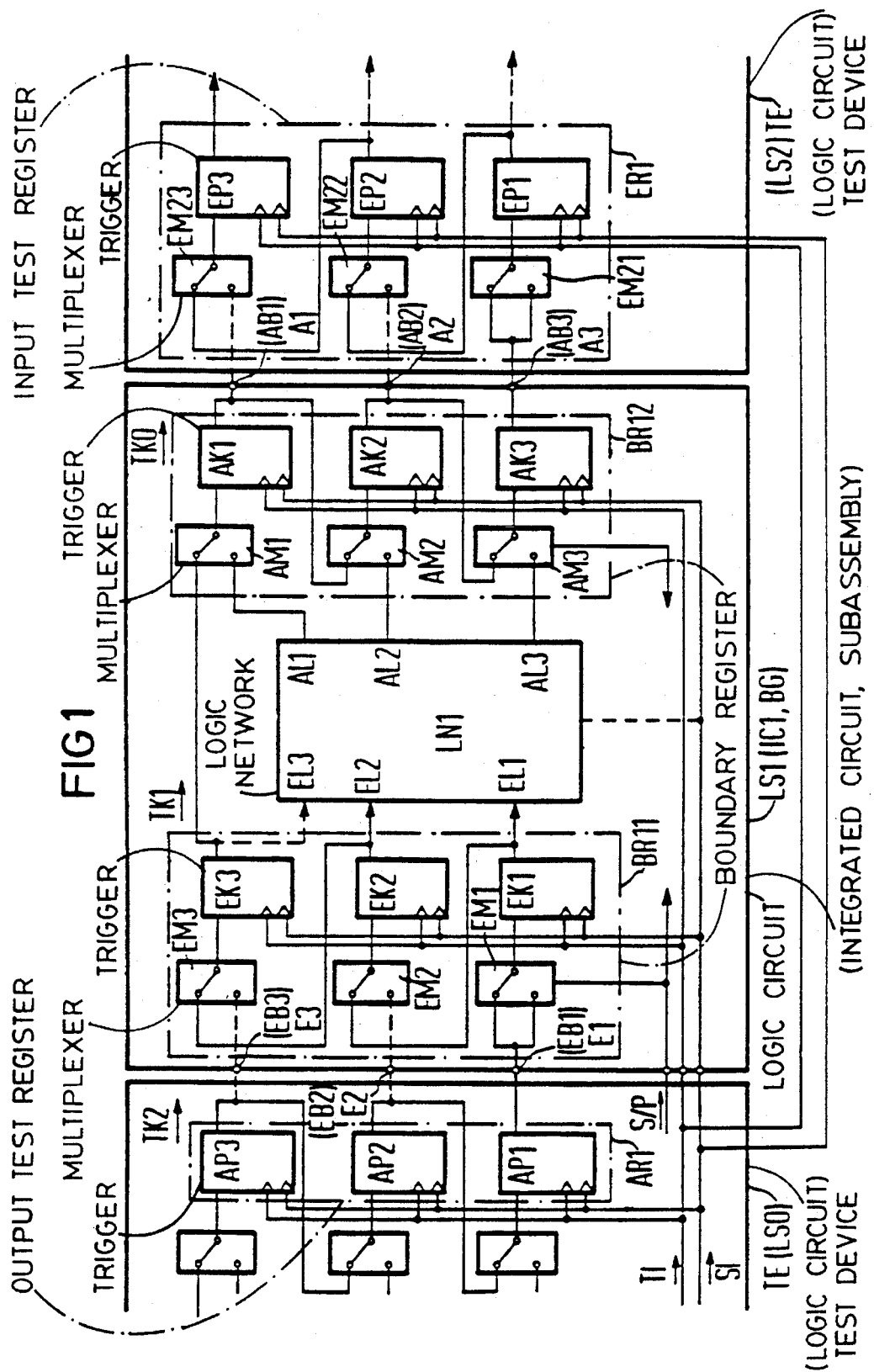
FIG. 1 shows a basic circuit diagram of a testable logic circuit.

The basic circuit diagram represented in FIG. 1 shows a logic circuit LS1 of an integrated circuit IC1, in the input lines of which the series connection of an input multiplexer EM1 and of an input trigger circuit EK1; EM2 and EK2; EM3 and EK3 is respectively connected. By means of the multiplexers, the inputs (terminal points) E1 to E3 of the integrated circuit IC1 can be connected to the inputs EL1 to EL3 of a logical network LN1. In this state, the operating mode, the logic circuit performs its actual function. The multiplexers EM1 to EM3—controlled by a signal S/P—also permit however, for test purposes, an interconnection of the input trigger circuits EK1 to EK3 to form a shift register (serial mode), as represented in FIG. 1. In a corresponding way, the outputs AL1 to AL3 of the logic network LN1 are connected by means of output multiplexers AM1 to AM3 to output trigger circuits AK1 to AK3. By means of the output multiplexers, the output trigger circuits can likewise be connected in series, so that they too form a shift register which is connected to the output of the last trigger circuit EK3 of the shift register on the input side. In this serial mode, test combinations can be written serially to the shift registers.

Figure 5:
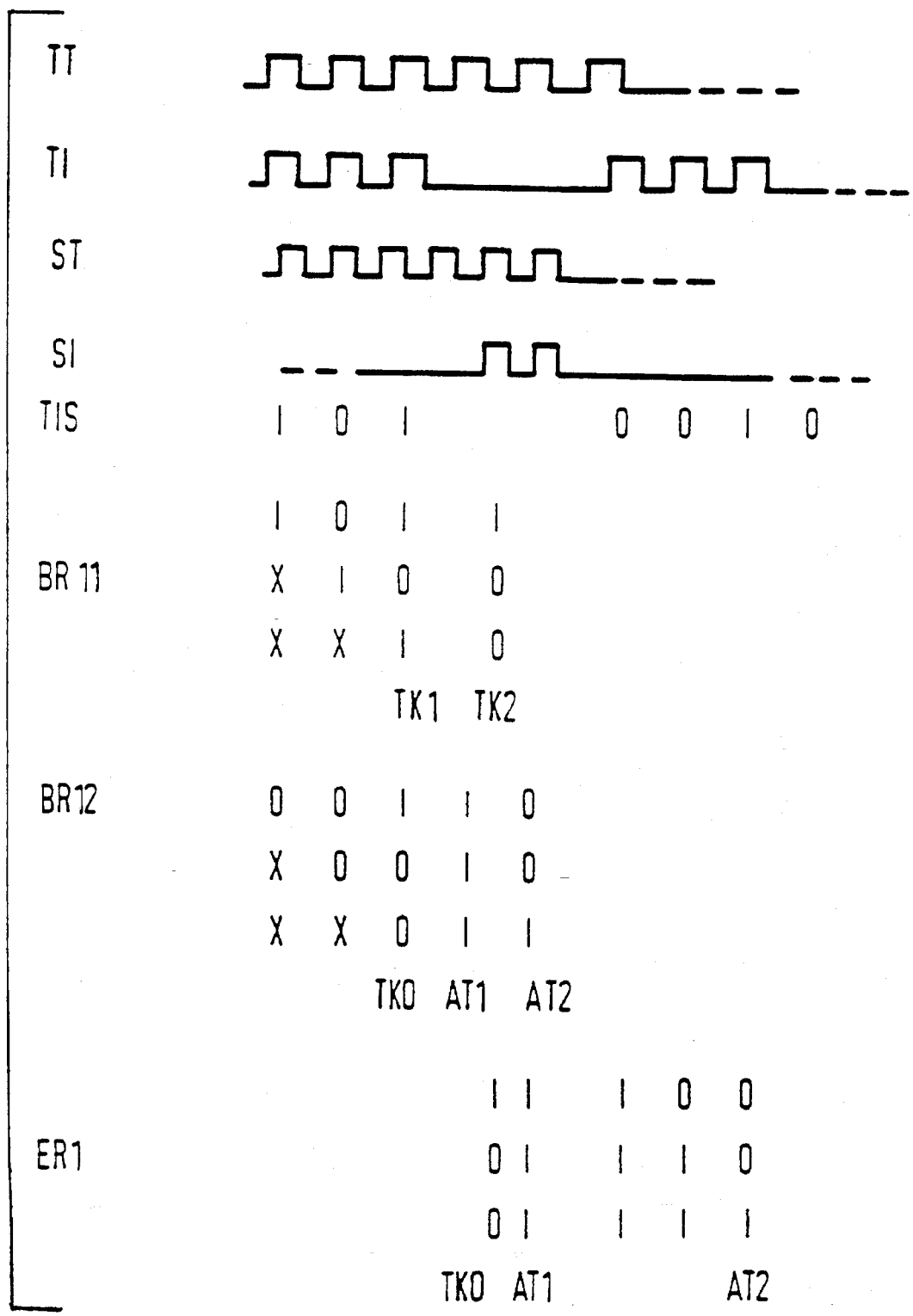

The data flow in both shift registers can take place in any desired direction. The input trigger circuits and the output trigger circuits are in each case fed, for test purposes, individual pulses TI or SI of two different clock signals, a test clock signal TT and a system clock signal ST (FIG. 5). In the case of an alternative circuit arrangement, trigger circuits with only one clock input may also be chosen, it then being necessary to switch over between the two clock signals.

The logic circuit LS1 may have another logic circuit LS0 connected upstream of it and a further logic circuit LS2 connected downstream of it. The inputs E1 to E3 of the first logic circuit LS1 are connected in FIG. 1 to the outputs of a test device TE and the outputs A1 to A3 of the last logic circuit are connected to the inputs of the test device. In FIG. 1, for reasons of overall clarity, only one logic circuit has been represented and the designations of the logic circuits possibly connected upstream and downstream added instead in brackets. The output trigger circuits of the upstream test device or logic circuit are denoted by AP1 to AP3. In the case of a logic circuit, they are in turn interconnectable by means of multiplexers in a chain to form a shift register; in the case of a test device, this is generally not necessary.

Connected to the outputs A1 to A3 of the logic circuit are the inputs of the test device TE or of the downstream logic circuit LS2 by means of input multiplexers EM21 to EM23. The information of the output trigger circuits AK1 to AK3 of the logic circuit LS1 can be transferred by means of the multiplexers EM21 to EM23 in parallel into trigger circuits EP1 to EP3, which serve in the test device as input test stages. Often, a plurality of logic circuits LS0, LS1, LS2, ... are connected in a chain. These may be arranged in an integrated circuit or else belong to a plurality of circuits. For logic circuits connected in a chain to form a multistage network, the serial writing of the test combinations is absolutely necessary.

In the test device, the multiplexers EM21 to EM23 are not absolutely necessary; however, they allow the serial writing of the binary output combinations emitted by the output trigger circuits AK1 to AK3 and of the logic states stored in the input trigger circuits EK1 to EK3. The number of input test stages EP must of course be increased if it is intended to check more output combinations in one test section and the output combination of a logic circuit is not in each case checked in a plurality of test sections. In the case of only one logic circuit, as represented in FIG. 1, the test combination can of course also be transferred in parallel via the inputs E1 to E3. However, for a better understanding of the function of the test process, initially the restriction to one logic circuit is to be retained. If said logic circuit is fitted on a subassembly, in the case of operation and for testing, the signals are fed via inputs of the subassembly EB1 to EB3. The input trigger circuits of the logic circuit are combined to form a boundary register BR11, the output trigger circuits are combined to form a boundary register BR12 and the output and input test stages are combined to form an output test register AR1 and an input test register ER1, respectively.

Test combinations applied in parallel to the inputs EB1 to EB3 of the subassembly BG allow checking of the input lines and of the soldered junctions; test combinations written serially to the output trigger circuits permit a checking of the soldered junctions and of the output lines or of the connecting lines between the modules.

The dynamic testing can of course be carried out both in the case of subassemblies and in the case of individual integrated circuits which are fitted into corresponding adaptors of a test device. However, the process is used predominantly for the testing of subassemblies with individual or a plurality of integrated circuits.

The static testing of the logic circuit LS1 can be carried out as in the case of previous boundary-scan processes by writing all relevant test combinations to the input trigger circuits EK1 to EK3 and by taking over the output combination AT1 produced by the logic circuit LS1 (or the logic network LN1) into the output trigger circuits AK1 to AK3 and reading it out from these trigger circuits in order to be checked in the test device TE.

For dynamic testing, test combinations TK1, TK2 are written with clock pulses TI (FIG. 5) of the test clock signal TT to the input trigger circuits EK1 to EK3 and the output test stages AP1 to AP3—that is to say a test double combination. For static checking of the output lines, the test combination TK0 was also written serially to the output trigger circuits AK1 to AK3 in advance. As a result of this, the test combination TK1 also had to be written serially to the input trigger circuits if the same test clock pulses are fed to both groups of trigger circuits EK1 to EK3 and AK1 to AK3.

Figure 2:
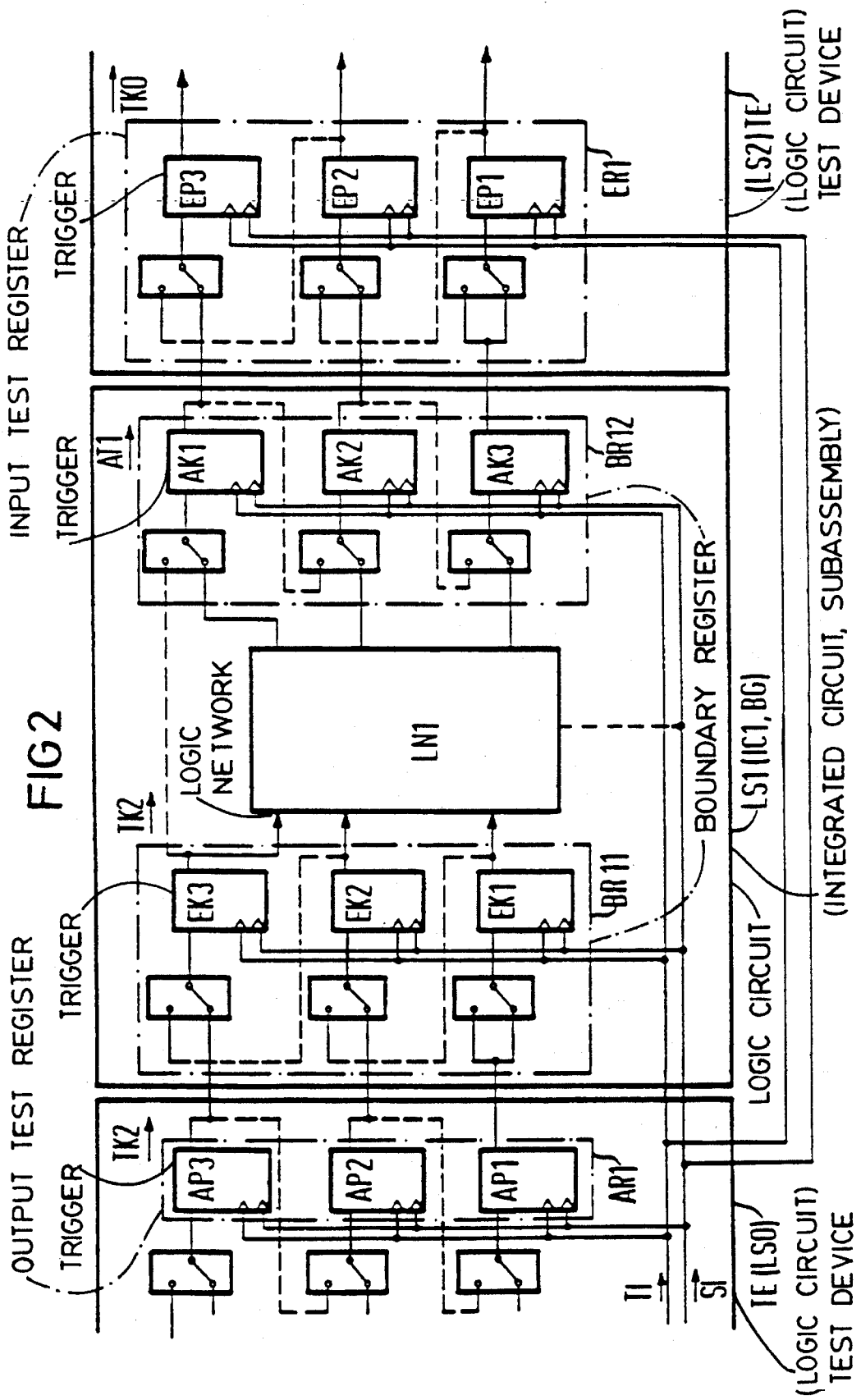
FIG. 2 shows the basic circuit diagram for the dynamic testing.

Subsequently, the multiplexers are switched over from serial mode into operating mode, as represented in FIG. 2, and instead of clock pulses TI of the test clock signal TT system test pulses SI of the system clock signal ST (FIG. 5) are fed to the trigger circuits and, if appropriate, also to the logic network LN1. The system clock signal may be generated by a clock generator of the system to be tested and fed by said generator via the test device. Similarly, it may be supplied by an adjustable generator of the test device. In the test device, control devices (counter devices) are provided, which make it possible to call up any number of clock pulses TI and system test pulses SI within a test cycle, which comprises clock pulses TI for serial writing and reading and system test pulses for dynamic testing.

To enhance overall clarity, in FIG. 2 the output trigger circuits AP1 to AP3 are combined to form an output test register AR1, the input trigger circuits EP1 to EP3 are combined to form an input test register ER1 and the input and output trigger circuits of the logic circuit are combined to form boundary registers.

With the first system test pulse SI, the new test combination TK2 is transferred by the output test stages AP1 to AP3 into the input trigger circuits EK1 to EK3 of the logic circuit LS1. With the same pulse— for static functional testing—the output combination AT1, already available as a function of the first test combination TK1 at the outputs of the logic network LN1, is transferred into the output trigger circuits AK1 to AK3. The test combination TK0 is at the same time written in parallel to the input test stages EP1 to EP3 of the test device for checking the connecting lines. The test and output combinations specified in FIG. 2 apply for this phase.

With the second system test pulse, the dynamic function of the logic circuit LS1 is checked by establishing whether the output combination AT2 of the logic circuit corresponding to the new test combination TK2 has already been transferred into the output trigger circuits AK1 to AK3 or whether errors are occurring on account of excessive running times. In principle, it is also possible to take over the second output combination AT2 serially into the test device TE. However, a parallel takeover saves more time, but is possible only in the case of a logic circuit to be tested (or in the case of the last output combination if a plurality of logic circuits are connected in a chain). For this purpose, a third system test pulse is necessary. In the test device, a further test register is required if it is intended for the preceding output combination TK1 also to be checked.

With the second system test pulse, the test combination at the input of the logic network LN1 does not change if the input states of the input trigger circuits also remain unchanged. Thus, a first system test pulse would suffice for clocking the input trigger circuits EK1 to EK3. Since the suppression of the second (and a further) system test pulse would increase the circuitry, it is, however, still fed to the input trigger circuits. Correspondingly, for dynamic testing, only the second test pulse is required for the output trigger circuits. In special cases, the applying of a third test combination with the second system test pulse may also be expedient for testing.

Figure 3:
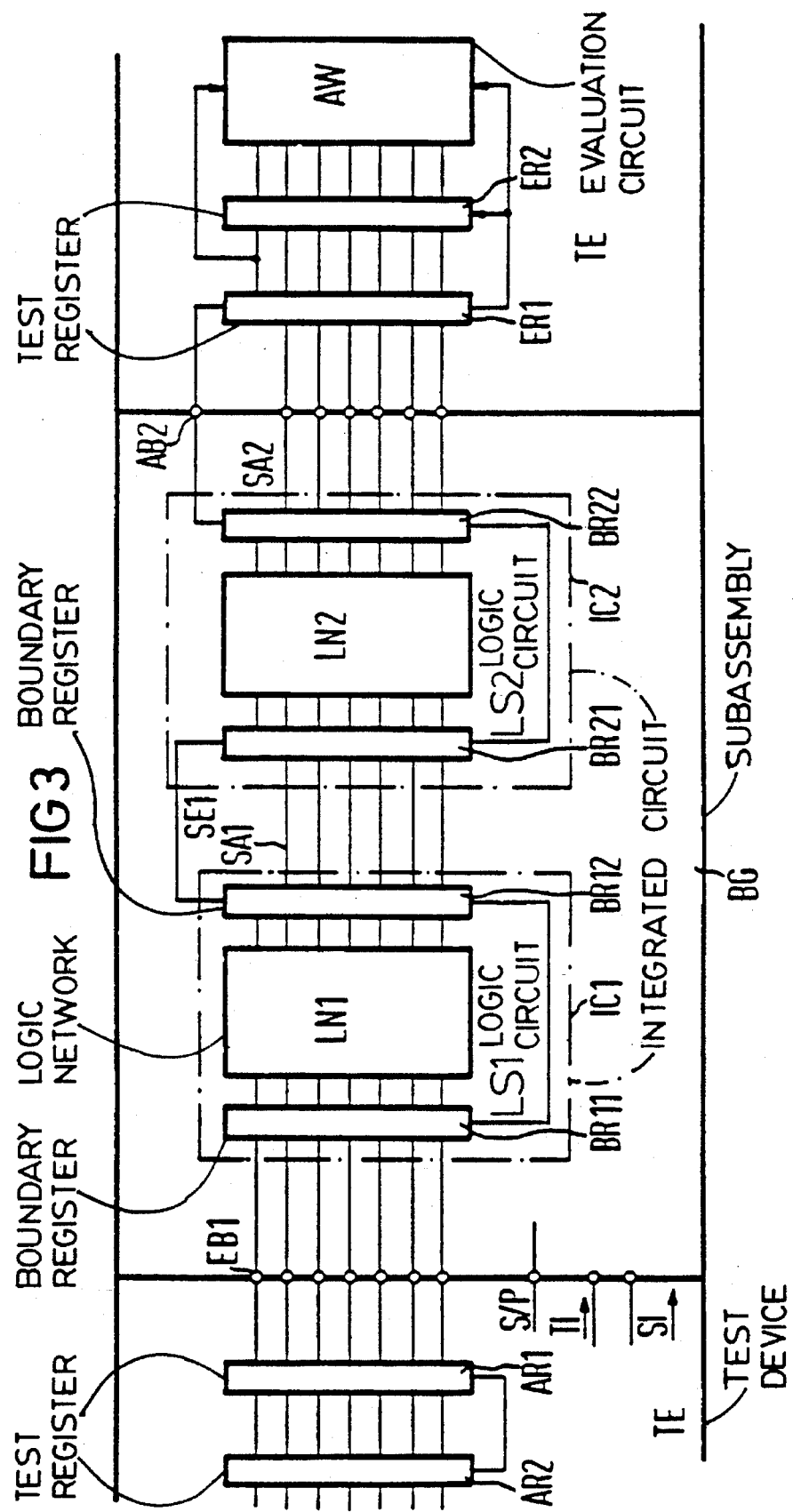
FIG. 3 shows a basic circuit diagram of a subassembly with a plurality of logic circuits and connected test device.

In principle, the use of a test cycle with two test combinations and two system test pulses, according to which the output combinations are in each case evaluated, suffices Represented in FIG. 3 is a subassembly BG, in which a plurality of logic circuits LS1, LS2 of integrated circuits IC1 and IC2 are connected in a chain. The input trigger circuits and output trigger circuits are represented as combined to form the boundary registers BR11 to BR22. The test combinations are written serially from the test device TE via the input EB1 to the input and output trigger circuits of the logic circuits LS1 and LS2. After two system test pulses SI, the input trigger circuits of the boundary register BR12 of the second logic circuit LS2 and of the test register ER1 of the test device TE contain the result of the static checking of the two logic circuits. The output trigger circuits (register BR12, BR22) contain the output combinations of the dynamic testing. By this process, a test with test combinations which are defined—not dependent on an upstream circuit—is possible. The reading and checking of the output combinations may take place in a plurality of sections. During the serial reading and checking of the output combinations, new test combinations are already written and the next dynamic testing follows.

The static checking of the logic circuit may also be performed already in the conventional boundary-scan testing.

After such a check, it is then also possible to operate with a test cycle comprising three system test pulses, in which the first (static) output combination of the first logic circuit LS1 is initially stored in the boundary register BR12, is then transferred into the boundary register BR21 of the next logic circuit LS2 and is finally overwritten by the first "dynamic" output combination AT2. The test device must then of course have a corresponding number of input test registers ER1, ER2, . . . , the contents of which are checked in parallel or at staggered times during the writing of new test combinations to an evaluation circuit AW. If the test device likewise has a plurality of output test registers AR1, AR2, . . . , of which the output test registers AR1 and AR2 are drawn-in in FIG. 3 (or if the test combinations can be sent to the system test signal correspondingly quickly), the test may take place with a plurality of successive test combinations, whereby the testing time is shortened. In the case of circuits connected in a chain, a plurality of output combinations of the upstream logic circuits—here the logic circuit LS1 —is then overwritten in every test cycle; a "test over everything" is carried out, which has to be supplemented if an error occurs by test cycles with in each case two system test pulses for localization of the error.

It is also possible for there to be in an integrated module a plurality of logic circuits, which may be interconnected in a chain. Similarly, a subassembly (or an ASIC) will often have more than two integrated circuits. In addition, the connecting lines may also branch from outputs of a logic circuit in plurality. For the serial writing or reading of test information, again all the input trigger circuits and output trigger circuits are connected in series as shift registers and, for dynamic testing, are switched into the operating mode.

The logic circuits may also have memory elements, which are clocked in operation by the system clock signal. Their function can also be checked by increasing the number of system test pulses SI until the change in the output combination caused by the memory element occurs.

A logic circuit can be completely checked by each desired test combination being followed in each case by all the remaining test combinations. However, it is sufficient to check the actually occurring sequences of the input combinations. The creation of the test program is generally performed in a computer-aided manner. The serial reading in and out and also the evaluation are also controlled by the test program.

Figure 4:
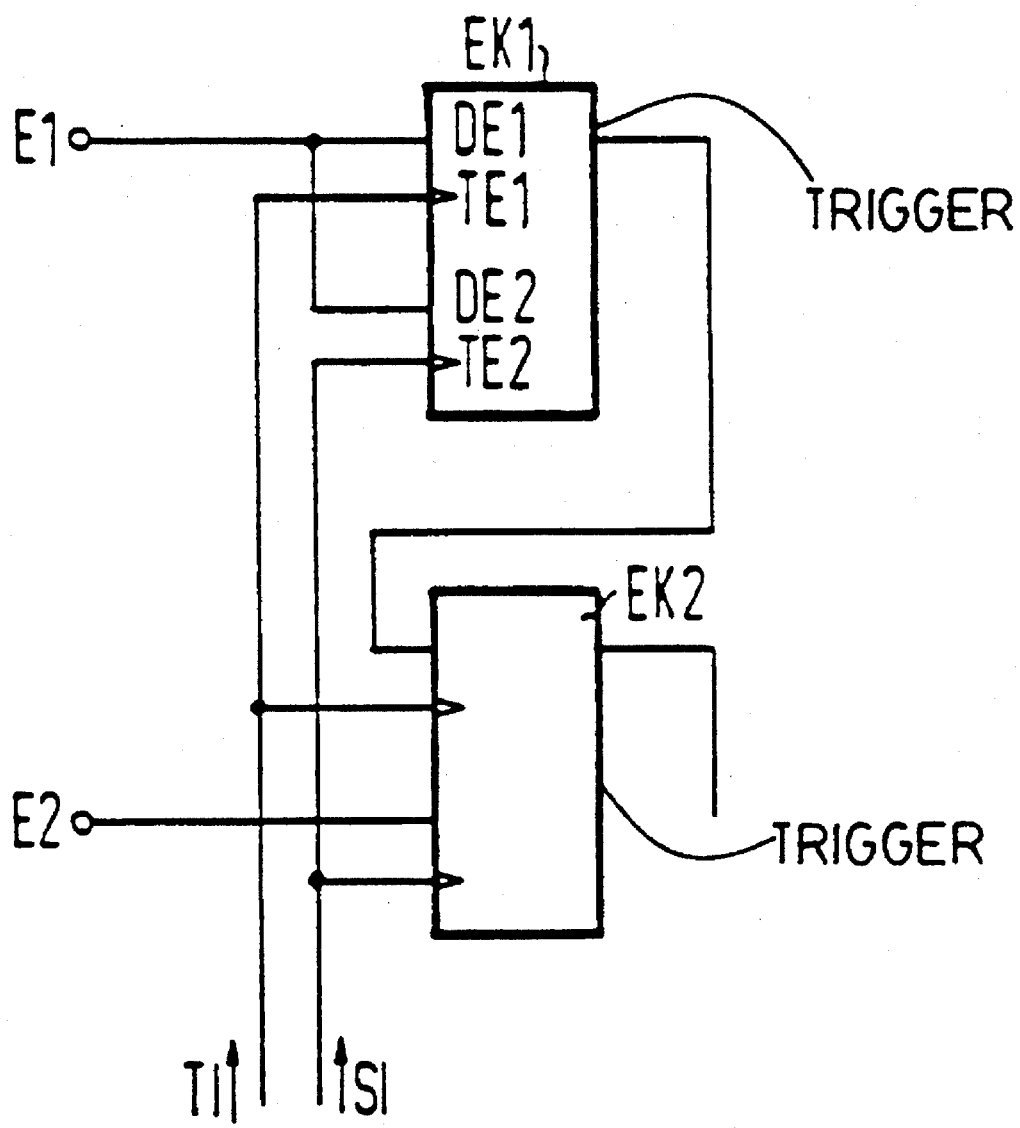
FIG. 4 shows a variant of the input and output trigger circuits and FIG. 5 shows a timing diagram with test clock signals and system clock signals.

Represented in FIG. 4 is a circuit variant in which the multiplexers are replaced by the use of special trigger circuits with two clock inputs TE1 and TE2. Each clock input is assigned a data input DE1 and DE2, respectively. The data and clock inputs are logically combined in each case by means of an OR gate.

With the pulses TI of the test clock signal TT, the logic output signal of the preceding trigger circuit EK2 is automatically transferred into the following trigger circuit. With the pulses SI of the system clock signal or of the system test signal, on the other hand, a parallel data takeover into the input trigger circuits takes place. This arrangement may also be used for the output trigger circuits.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A process for testing integrated modules having at least one logic circuit, said at least one logic circuit having a logic network surrounded by boundary-scan cells, in which process, for static testing in a serial mode, input trigger circuits and output trigger circuits of the boundary-scan cells are connected in series as shift registers for serial writing and reading of test information, and at least one test combination being written to at least one of the input trigger circuits and the output trigger circuits, comprising the steps of: for dynamic testing, in an operating mode, connecting the input trigger circuits into signal lines between input terminal points of the logic circuit and inputs of the logic network, connecting the output trigger circuits into signal lines between the outputs of the logic network and output terminal points of the logic circuit; for dynamic testing, writing a first test combination to the at least one of the input trigger circuits and the output trigger circuits applying at least one second test combination from parallel outputs of a test device or of an upstream logic circuit to the input terminal points of the input trigger circuits; before the dynamic testing with at least two successive system test pulses, switching the input trigger circuits and the output trigger circuits from the serial mode into the operating mode; transferring with a first system test pulse the second test combination, and transferring with each further system test pulse a further test combination, in parallel into the input trigger circuits; storing with a second system test pulse, and storing with each further system test pulse, an output combination of the at least one logic circuit as a logical sequence of the second test combination, and of further test combinations, in the output trigger circuits; and checking the output combinations in the test device.

2. The process as claimed in claim 1, wherein the input trigger circuits and the output trigger circuits are driven by the same system test pulse and by at least two successive system test pulses.

3. The process as claimed in claim 1, wherein the test combinations are written to the input trigger circuits and output trigger circuits, forming boundary registers of logic circuits connected in a chain.

4. The process as claimed in claim 3, wherein the output combinations stored in the boundary registers are read out serially.

5. The process as claimed in claim 1, wherein the output combinations of the last logic circuit are transferred in parallel into the test device.

6. The process as claimed in claim 1, wherein all sequences of test combinations are successively tested for testing the logic circuit.

7. The process as claimed in claim 1, wherein the logic network has clocked memory elements, and wherein the number of system test clocks is increased until a change occurs in the output combination caused by a respective memory element.

8. A testable integrated circuit having at least one logic circuit, said at least one logic circuit having a logic network surrounded by boundary-scan cells, said integrated circuit, for serial writing and reading of test information, input trigger circuits and output trigger circuits of the boundary-scan cells being connected in series as shift registers, comprising: for dynamic testing and in an operating mode, the input trigger circuits connected into signal lines between input terminal points of the logic circuit and inputs of the logic network, and the output trigger circuits connected into signal lines between outputs of the logic network and output terminal points of the logic circuit.

9. The testable integrated circuit as claimed in claim 8, wherein the inputs of the input trigger circuits and the inputs of the output trigger circuits have multiplexers connected upstream of them, by which the input and output trigger circuits can be connected into the respective signal lines or connected as shift registers; which the input trigger circuits and the output trigger circuits have two clock inputs; and wherein equivalent clock inputs of the input trigger circuits and output trigger circuits are interconnected.

10. The testable integrated circuit as claimed in claim 8, wherein each of the input trigger circuits and the output trigger circuits have two clock inputs, each of the clock inputs having an assigned data input and being connected by one data input into the respective signal line and being connected by the other data input to a preceding trigger circuit as a shift register.

* * * * *